(12) United States Patent
Berger et al.

(10) Patent No.: US 10,784,172 B2
(45) Date of Patent: Sep. 22, 2020

(54) TESTING SOLID STATE DEVICES BEFORE COMPLETING MANUFACTURE

(71) Applicant: TEXAS INSTRUMENTS INCORPORATED, Dallas, TX (US)

(72) Inventors: Cody Michael Berger, Melissa, TX (US); Ramana Tadepalli, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 275 days.

(21) Appl. No.: 15/897,879

(22) Filed: Feb. 15, 2018

(65) Prior Publication Data

US 2019/0206746 A1   Jul. 4, 2019

Related U.S. Application Data

(60) Provisional application No. 62/612,312, filed on Dec. 29, 2017.

(51) Int. Cl.

| | |
|---|---|
| *G01R 31/18* | (2006.01) |
| *H01L 29/24* | (2006.01) |
| *G01R 31/26* | (2020.01) |
| *H01L 29/778* | (2006.01) |
| *H01L 21/66* | (2006.01) |
| *H01L 29/20* | (2006.01) |
| *H01L 29/205* | (2006.01) |
| *H01L 29/40* | (2006.01) |
| *H01L 29/66* | (2006.01) |
| *H01L 29/16* | (2006.01) |

(52) U.S. Cl.
CPC ............. *H01L 22/12* (2013.01); *G01R 31/18* (2013.01); *G01R 31/2601* (2013.01); *H01L 22/14* (2013.01); *H01L 22/32* (2013.01); *H01L 29/16* (2013.01); *H01L 29/20* (2013.01); *H01L 29/2003* (2013.01); *H01L 29/205* (2013.01); *H01L 29/24* (2013.01); *H01L 29/402* (2013.01); *H01L 29/408* (2013.01); *H01L 29/66462* (2013.01); *H01L 29/7787* (2013.01)

(58) Field of Classification Search
CPC ..... H01L 22/12; H01L 22/32; H01L 29/7787; H01L 29/24; H01L 29/20; H01L 29/16; H01L 29/66462; H01L 29/402; H01L 29/408; H01L 29/205; H01L 29/2003; G01R 31/2601; G01R 31/18
USPC .................................................... 324/762.05
See application file for complete search history.

(56) References Cited

U.S. PATENT DOCUMENTS 6,191,443 B1 * 2/2001 Al-Shareef ............. H01L 28/40
257/310
6,309,895 B1 * 10/2001 Jaing .................... C23C 14/088
257/E21.01

(Continued)

*Primary Examiner* — Christopher P McAndrew
(74) *Attorney, Agent, or Firm* — Rose Alyssa Keagy; Charles A. Brill; Frank D. Cimino

(57) ABSTRACT

In some examples, a method for manufacturing a solid state device comprises forming a first layer of the solid state device; forming a conductive layer of the solid state device above the first layer, the conductive layer having an access pad formed on an end of the conductive layer; applying a voltage to the conductive layer using the access pad, the voltage forming an electric field in an area of the first layer beneath the conductive layer; and completing manufacture of the solid state device after applying the voltage.

19 Claims, 6 Drawing Sheets

(56) References Cited

U.S. PATENT DOCUMENTS

| | | | |
|---|---|---|---|
| 6,972,819 B2* | 12/2005 | Lee | G02F 1/134363 257/350 |
| 9,871,034 B1* | 1/2018 | Or-Bach | H01L 27/04 |
| 10,204,927 B2* | 2/2019 | Li | H01L 27/124 |
| 10,388,601 B2* | 8/2019 | Brown | H01L 21/76838 |
| 2002/0076885 A1* | 6/2002 | Chen | H01L 21/823835 438/270 |
| 2005/0224793 A1* | 10/2005 | Chang | H01L 27/1237 257/59 |
| 2006/0091489 A1* | 5/2006 | Cheng | H01L 31/105 257/458 |
| 2008/0145995 A1* | 6/2008 | Borland | H05K 1/162 438/381 |
| 2010/0148813 A1* | 6/2010 | Erickson | G01Q 60/30 324/754.03 |
| 2010/0207648 A1* | 8/2010 | Zhu | H01L 22/34 324/719 |
| 2011/0003428 A1* | 1/2011 | Sasaki | H01L 29/78606 438/104 |
| 2013/0015587 A1* | 1/2013 | Okutsu | G01R 31/275 257/774 |
| 2013/0105924 A1* | 5/2013 | Kobayashi | H01L 27/1464 257/431 |
| 2013/0244351 A1* | 9/2013 | Yamashita | G01R 31/26 438/17 |
| 2014/0015557 A1* | 1/2014 | Kiermasz | G01R 31/2601 324/750.03 |
| 2014/0021978 A1* | 1/2014 | Ikeda | G01R 31/2889 324/762.06 |
| 2014/0092505 A1* | 4/2014 | Norris | G01R 1/203 361/56 |
| 2014/0111243 A1* | 4/2014 | Kumar Goel | G01R 31/2601 324/762.02 |
| 2014/0218063 A1* | 8/2014 | Roberts, Jr. | G01R 31/2601 324/756.02 |
| 2015/0008393 A1* | 1/2015 | Mangum | H01L 33/56 257/14 |
| 2015/0014822 A1* | 1/2015 | Reynaud | H01L 22/20 257/632 |
| 2015/0162323 A1* | 6/2015 | Taya | H01L 21/26513 257/296 |
| 2016/0020280 A1* | 1/2016 | Heo | H01L 29/7869 257/27 |
| 2016/0185535 A1* | 6/2016 | Kim | G01R 31/2893 324/750.16 |
| 2017/0186829 A1* | 6/2017 | Yamazaki | H01L 51/0024 |
| 2017/0244059 A1* | 8/2017 | Sasaki | H01L 27/3262 |
| 2018/0138134 A1* | 5/2018 | Chikamatsu | H01L 21/4842 |

* cited by examiner

TESTING SOLID STATE DEVICES BEFORE COMPLETING MANUFACTURE

CROSS-REFERENCE TO RELATED APPLICATIONS

The present application claims priority to U.S. Provisional Patent Application No. 62/612,312, which was filed Dec. 29, 2017, is titled "Testing Solid State Devices Before Completing Manufacture," and is hereby incorporated herein by reference in its entirety.

BACKGROUND

Various types of solid state devices are manufactured for use in a variety of applications. Examples of solid state devices include silicon-based devices and gallium-nitride (GaN) devices. Many of these devices are tested for quality assurance purposes.

SUMMARY

In some examples, a method for manufacturing a solid state device comprises forming a first layer of the solid state device; forming a conductive layer of the solid state device above the first layer, the conductive layer having an access pad formed on an end of the conductive layer; applying a voltage to the conductive layer using the access pad, the voltage forming an electric field in an area of the first layer beneath the conductive layer; and completing manufacture of the solid state device after applying the voltage.

In some examples, a method for manufacturing a solid state device includes providing a dielectric layer, the dielectric layer having a target portion to be stress tested; forming a conductive layer, the conductive layer patterned to include a conductive segment above the target portion of the dielectric layer and a discontinuous segment above another portion of the dielectric layer; and placing a probe in contact with the conductive layer. The method also comprises using the probe to apply a voltage in the conductive layer to form an electric field in the target portion of the dielectric layer, and after applying the voltage, forming a third layer above the conductive layer.

In some examples, a method of stress testing a partially-manufactured solid state device comprises obtaining the partially-manufactured solid state device having a dielectric layer and a metal layer formed above the dielectric layer and applying a voltage to the metal layer of the partially-manufactured solid state device, wherein the voltage forms an electric field in the dielectric layer.

BRIEF DESCRIPTION OF THE DRAWINGS

For a detailed description of various examples, reference will now be made to the accompanying drawings in which.

DETAILED DESCRIPTION

Certain components of solid state devices, such as dielectric layers in field effect transistors (FETs), require testing to ensure that they meet target performance parameters. Such testing is useful, for example, in latent defect acceleration and to monitor the quality of the fabrication process. In many cases, probes are used to apply voltages to specific parts of the device, and these voltages form electric fields in targeted components of the device that require testing. Typically, probe testing occurs after the device has been manufactured. For example, the device may be manufactured to facilitate electrical access to certain components in the device so that, even post-manufacture, voltages can be applied to components of the device that would otherwise not be physically accessible. However, even with such access points, not all components of the device are accessible for testing post-manufacture. In addition, certain types of devices, such as GaN devices, include field plates which, once formed in the device, prevent electric fields from properly forming and stressing components below those field plates that have been targeted for testing.

Disclosed herein are various examples of techniques for testing solid state devices during manufacture, i.e., before manufacture of the device is complete. More specifically, during the manufacturing process, voltages are applied to conductive layers in the device to stress other layers, such as dielectric layers, positioned below the conductive layers. Such stress testing is performed as the layers requiring testing are formed in the device. After a particular layer has been formed and stress tested, the manufacturing process continues by adding additional layers, stress testing those layers, and repeating the process until manufacture is complete. Certain techniques may be employed to mitigate testing-related damage (e.g., contamination, damage at the contact points between probes and conductive layers, etc.) to the device during manufacture. For example, conductive layers to which voltages are applied are patterned to include access pads that are used to apply one or more probes to the conductive layers and that are subsequently removed, for instance, by etching. By performing stress tests during manufacture in a way that reduces testing-related damage to the device, the numerous disadvantages associated with post-manufacture stress testing are mitigated. Illustrative examples of such techniques are now described in detail with respect to the drawings in FIGS. 1A-4C.

Figure 1A:
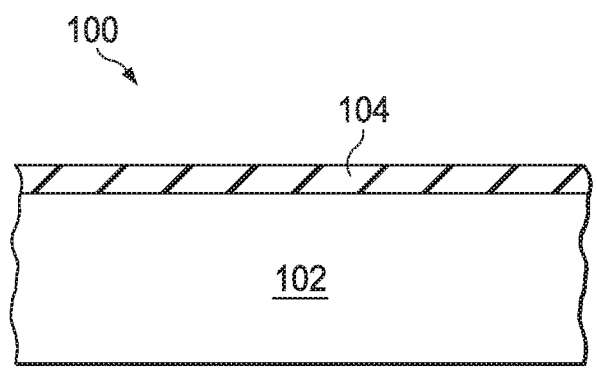
FIGS. 1A-1G depict side and top-down views of various aspects of a solid state device manufacturing and testing process, in accordance with various examples.

FIGS. 1A-1G depict side and top-down views of various aspects of a solid state device manufacturing and testing process, in accordance with various examples. FIG. 1A depicts a side view of a partially-manufactured solid state device 100 comprising a semiconductor substrate layer 102, i.e., a semiconductor wafer. The semiconductor substrate layer 102 may be composed of any semiconductor material, such as silicon, gallium arsenide, gallium nitride, or gallium oxide. Other types of semiconductor materials are contemplated and included in the scope of this disclosure. A dielectric layer 104 is formed above the substrate layer 102. The dielectric layer 104 may be composed of any suitable dielectric material, such as silicon dioxide or silicon nitride. Other types of dielectrics are contemplated and fall within the scope of this disclosure. In some examples, the dielectric layer 104 is formed immediately abutting the substrate 102, and in other examples, one or more intervening layers are formed between the substrate 102 and the dielectric layer 104, so long as these intervening layers do not preclude the formation of an electric field in the dielectric layer 104. The partially-manufactured solid state device 100 depicted in FIG. 1A is merely illustrative. The stress testing techniques disclosed herein can be applied to any partially-manufactured solid state device having a layer to be stress tested with an electric field and a conductive layer above that layer to which a voltage can be applied.

Figure 1B:
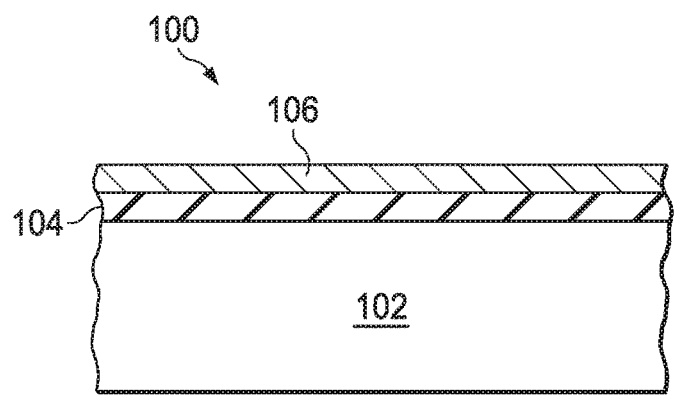

FIG. 1B depicts a side view of the solid state device 100 having a conductive layer 106 formed above the dielectric layer 104. The conductive layer 106 may be, for example, a metal layer. The conductive layer 106 may be composed of, for instance, an aluminum copper alloy, a titanium-tungsten alloy, a poly layer, etc. Other conductive materials are also contemplated and fall within the scope of this disclosure.

Figure 1C:
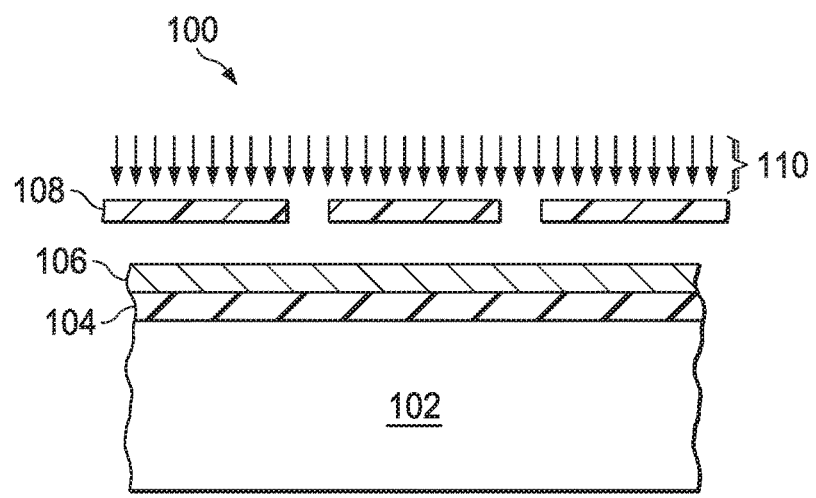

FIG. 1C depicts a side view of the solid state device 100 having its conductive layer 106 patterned to achieve a target geometry. The conductive layer 106 may be patterned, for example, using a mask 108 and a photolithography or suitable etching process, as numeral 110 indicates. The target geometry for the conductive layer 106 depends at least in part on the desired electric field formation (i.e., for stress testing) in the dielectric layer 104 upon application of a voltage to the conductive layer 106. For example, if it is desired to form an electric field in only a targeted portion of the dielectric layer 104, then the target geometry may be such that the conductive layer 106 includes a conductive segment above the targeted portion of the dielectric layer 104 in which the electric field is to form, and the conductive layer 106 includes a discontinuous segment(s) (i.e., one or more discontinuities, or "gaps," in the conductive material) above the portions of the dielectric layer 104 in which the electric field should not be formed. When a voltage is applied to the conductive segment, in some examples, an electric field forms in the portion of the dielectric layer 104 below (e.g., directly below) the conductive segment, but not in other portions of the dielectric layer 104, such as those having no conductive segments above them, or such as those having other conductive segments above them besides the conductive segment to which the voltage is applied.

Figure 1D:
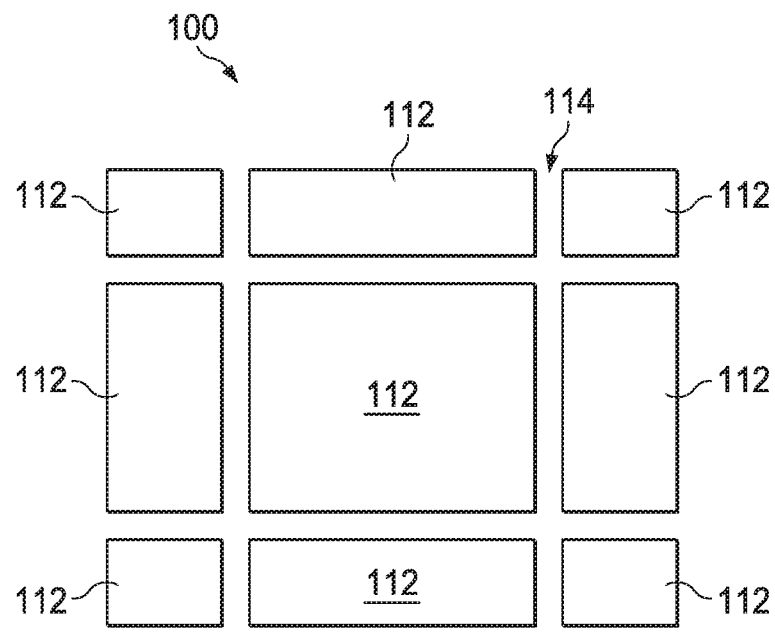
Figure 1E:
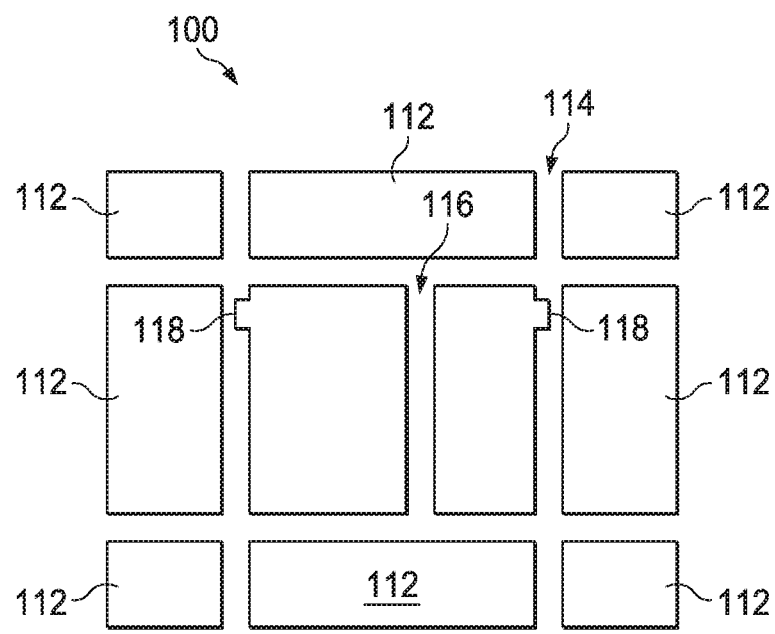

FIGS. 1D and 1E depict top-down views of the conductive layer 106 patterned with alternative geometries. The pattern depicted in FIG. 1D produces a plurality of dies 112 separated by scribe streets 114. Voltages can be applied to any of the dies 112 to produce electric fields in the portion of the dielectric layer 104 (not shown in FIG. 1D) below the die 112 to which the voltage is applied. An electric field may not form, however, in the portions of the dielectric layer 104 under other dies 112 and under the scribe streets 114. For this reason, the geometry of the conductive layer 106 drives the formation of electric fields in the dielectric layer 104, and so the conductive layer 106, in some examples, is patterned to achieve stress testing (i.e., electric field formation) in targeted areas of the dielectric layer 104.

In FIG. 1D, probes can be applied to areas of the dies 112 that are electrically inactive. Probe-induced incidental damage that occurs to inactive areas may be acceptable. However, in some examples, electrically inactive areas are not available. In such cases (and in other cases), electrically inactive areas called "access pads" may be added to the conductive layer 106. FIG. 1E depicts a geometry of the conductive layer 106 in which access pads 118 are formed on ends of dies 112. These access pads 118 may be of any suitable shape (e.g., rectangular, circular, semi-circular, etc.) and size and may be formed in any number. In some examples, the access pads 118 are positioned in the scribe streets 114, as shown. The geometry of FIG. 1E also includes a separation 116 of different portions of a die 112, i.e., portions of the die 112 that should be electrically separated from each other for functional reasons. In some examples, access pads 118 can be formed in such separations 116. Any desired geometry for the conductive layer 106 may be formed in this manner to manufacture a solid state device 100 with the intended functionality and with the ability to facilitate the development of electric fields in target portions of the dielectric layer 104 that are to be stress tested. Patterning, as with all other steps depicted in and described herein, occurs prior to completion of the solid state device manufacturing process.

Figure 1F:
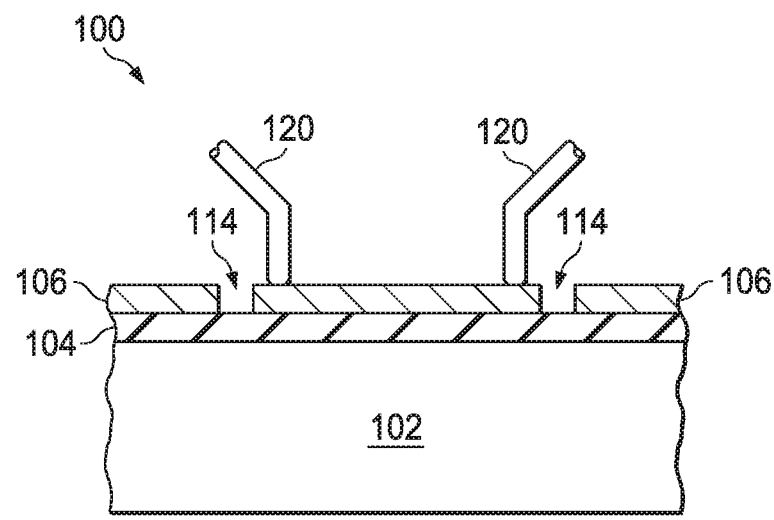

FIG. 1F depicts a side view of the partially-manufactured solid state device 100. The device 100 includes the substrate 102, the dielectric layer 104, and the patterned conductive layer 106 with, e.g., scribe streets 114. Other layers may be present as desired, as long as they do not preclude the formation of the desired electric fields in the desired portions of the dielectric layer 104 upon application of voltage in the corresponding portions of the conductive layer 106. Probes 120 can then contact the conductive layer 106 to apply voltage. For example, the probes 120 can contact inactive areas of a die 112 (FIGS. 1D and 1E), or the probes 120 can contact access pads 118 (FIG. 1E), or some combination of inactive areas and access pads. Application of voltage to a particular portion of the conductive layer 106 results in the formation of an electric field in the portion of the dielectric layer 104 that is positioned below the portion of the conductive layer 106 to which the voltage is applied. The electric field stresses the dielectric layer 104. The precise nature of the stress applied depends on the objectives and design of the stress test and may vary from test to test and device to device. The stress step depicted in FIG. 1F, as with the remaining steps, occurs prior to completion of the manufacture of the solid state device 100.

Figure 1G:
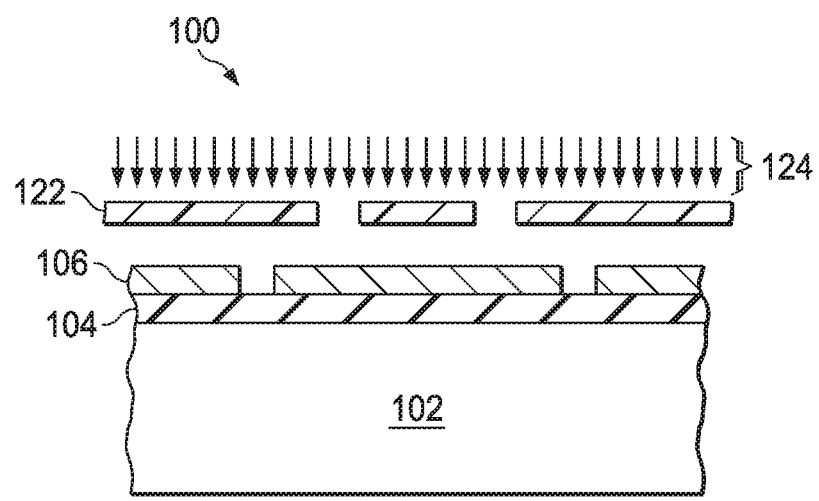

One or more of the steps depicted in FIGS. 1A-1F may be repeated as desired. For example, after the stress test of FIG. 1F is complete, additional dielectric and conductive layers may be formed above the conductive layer 106, and the stress testing may be repeated with those layers. This process may be repeated any number of times prior to completing the fabrication of the solid state device 100. As the side view of FIG. 1G depicts, after the solid state device 100 has been stress tested, a mask 122 and photolithography or etching process 124 may be used to continue forming the solid state device 100 as desired. Such a mask 122 and photolithography/etching process 124 also may be used to remove any access pads (e.g., access pads 118) that may have been formed for probing purposes.

Figure 2:
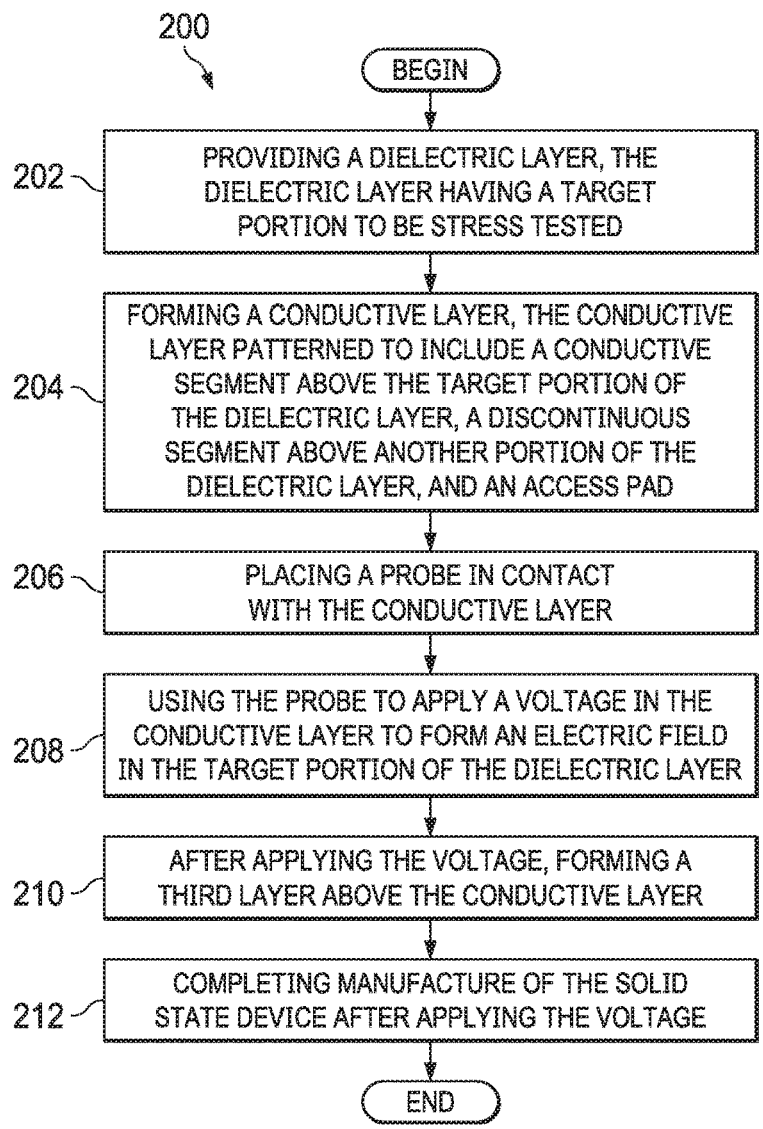
FIG. 2 depicts a flow diagram of an illustrative manufacturing and testing process, in accordance with various examples.

FIG. 2 depicts a flow diagram of an illustrative manufacturing and testing method 200, in accordance with various examples. The method 200 includes providing a dielectric layer, where the dielectric layer has a target portion that is to be stress tested (step 202). The method 200 also includes forming a conductive layer that is patterned to include a conductive segment above the target portion of the dielectric layer, a discontinuous segment above another portion of the dielectric layer, and one or more access pads (step 204). The method 200 comprises placing a probe in contact with the conductive layer (step 206) and using the probe to apply a voltage in the conductive layer to form an electric field in the target portion of the dielectric layer (step 208). The probe may make contact with inactive areas of conductive layers or with access pads of the conductive layers. (After the voltage has been applied and the dielectric layer stressed, any access pads are removed.)

The voltage applied by the probe is sufficient to stress (and thus mimic aging of) the dielectric layer, with higher voltages applying greater stress. After the dielectric layer has been stressed by the voltage to a desired degree, application of the voltage is stopped, and the leakage of the dielectric is measured. Specifically, a nominal voltage (i.e., a voltage less than the stress voltage) is applied to the dielectric and the amount of current that flows through the dielectric layer as a result of the nominal voltage is measured. Leakage indicates the health of the dielectric, with healthy dielectrics having less leakage than unhealthy dielectrics. The leakage data is then used to decide whether to keep or discard the device being tested. In some examples, the test is applied in a production scale context, meaning that the devices are not intentionally stressed to the point of failure.

The method 200 includes, after applying the voltage, forming a third layer above the conductive layer (step 210) and completing manufacture of the solid state device after applying the voltage (step 212). In at least some examples, completing manufacture of the solid state device after applying the voltage includes completing manufacture of the solid state device after forming the third layer in step 210. In some examples, several additional layers are formed after step 208, and manufacture of the solid state device is not complete until these additional layers have been formed. For example, in the context of gallium nitride devices, field plates may be formed prior to completion of solid state device manufacture. Some such layers (e.g., dielectric layers) may be stressed as described above, for example, by applying voltages to access pads or inactive areas of conductive layers above such layers. The method 200 may be modified as desired, including by adding, deleting, modifying, and/or rearranging one or more steps.

Figure 3:
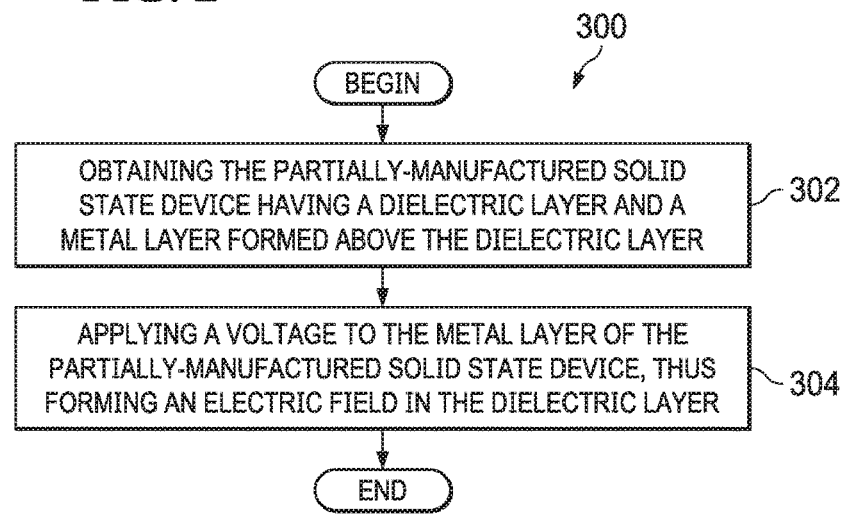
FIG. 3 depicts a flow diagram of an illustrative testing process performed prior to completing the manufacture of a solid state device, in accordance with various examples.

FIG. 3 depicts a flow diagram of an illustrative testing method 300 performed prior to completing the manufacture of a solid state device, in accordance with various examples. The method 300 includes obtaining a partially-manufactured solid state device having a dielectric layer and a conductive (e.g., metal) layer formed above the dielectric layer (step 302). The method 300 further comprises applying a voltage to the conductive layer of the partially-manufactured solid state device, thus forming an electric field in the dielectric layer (step 304). The method 300 may be modified as desired, including by adding, deleting, modifying, and/or rearranging one or more steps.

Figure 4A:
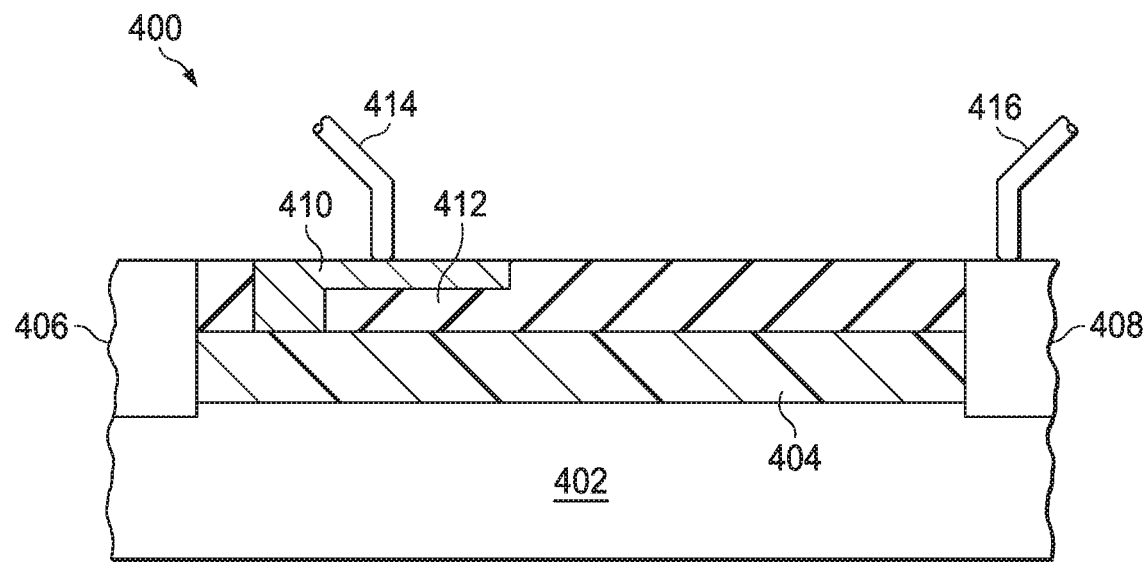
FIGS. 4A-4C depict illustrative testing methods in accordance with various examples.

FIG. 4A depicts an illustrative application of aspects of the testing methods described herein. In particular, FIG. 4A depicts an example of a partially-manufactured solid state device 400 comprising a GaN buffer layer 402, an AlGaN barrier 404 formed above the GaN buffer layer 402, a source terminal 406, a drain terminal 408, a gate terminal 410, and a dielectric layer 412. Before the manufacturing process of the device 400 is completed, probes 414 and 416 are touched to the gate terminal 410 and the drain terminal 408. The voltage stress described above is then applied to stress the dielectric layer 412 prior to completing the manufacture of the device 400, and leakage current data is measured, collected, analyzed, and acted upon to keep or discard the device 400.

Figure 4B:
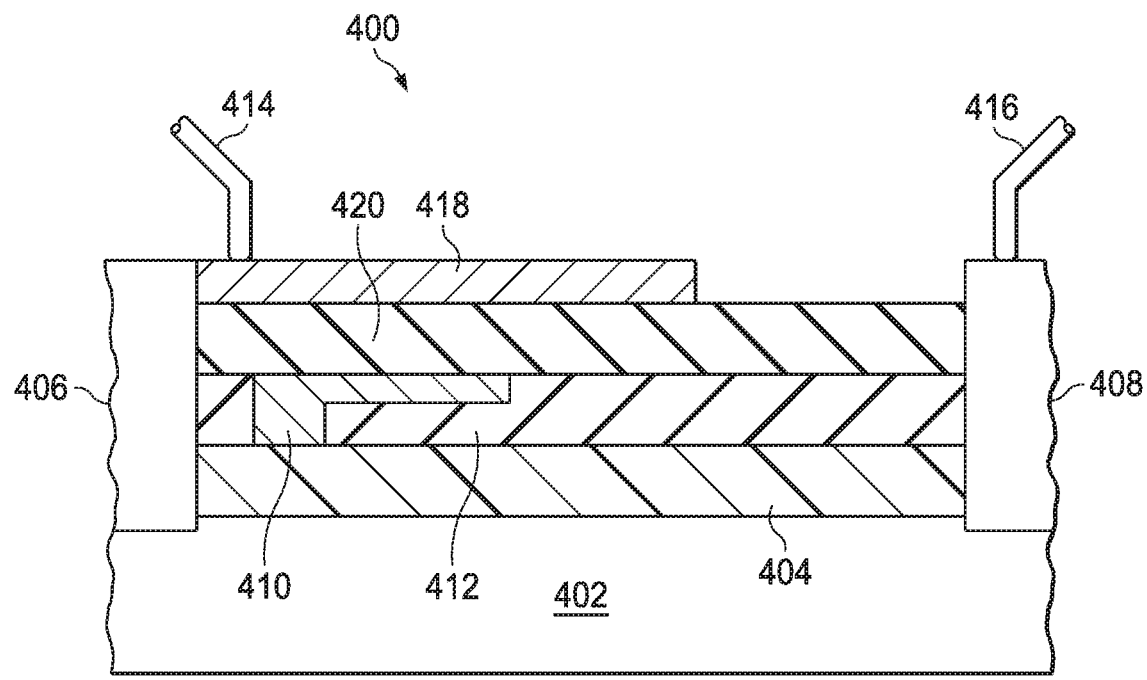

FIG. 4B depicts an illustrative application of aspects of the testing methods described herein. Specifically, FIG. 4B depicts an example of the partially-manufactured solid state device 400 comprising the GaN buffer layer 402, the AlGaN barrier 404 formed above the GaN buffer layer 402, the source terminal 406, the drain terminal 408, the gate terminal 410, and the dielectric layer 412. In addition, device 400 includes a conductive layer 418 and a dielectric layer 420 positioned between the conductive layer 418 and the gate terminal 410. Before the manufacturing process of the device 400 is completed, probes 414 and 416 are touched to the conductive layer 418 and the drain terminal 408. The voltage stress described above is then applied to stress the dielectric layer 420 prior to completing the manufacture of the device 400, and leakage current data is measured, collected, analyzed, and acted upon to keep or discard the device 400. In at least some cases, application of the voltage by the probes 414, 416 will stress the dielectric layer 420 but will not stress the dielectric 412 due to the presence of the gate terminal 410.

Figure 4C:
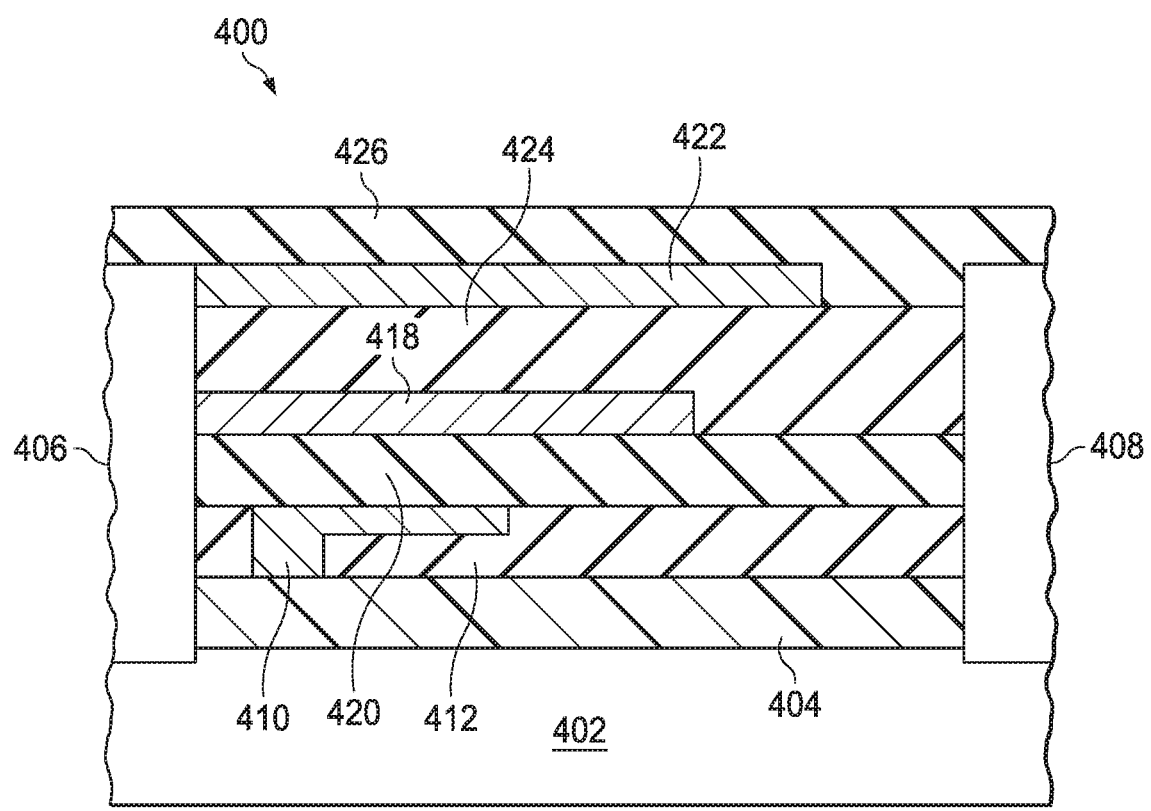

FIG. 4C depicts an illustrative application of aspects of the testing methods described herein. Specifically, FIG. 4C depicts an example of a completed, manufactured solid state device 400 comprising the GaN buffer layer 402, the AlGaN barrier 404 formed above the GaN buffer layer 402, the source terminal 406, the drain terminal 408, the gate terminal 410, and the dielectric layer 412. In addition, device 400 includes a conductive layer 418 and a dielectric layer 420 positioned between the conductive layer 418 and the gate terminal 410. The device 400 additionally comprises another conductive layer 422, a dielectric layer 424, and another dielectric layer 426. In examples, the conductive layers 418 and 422 are electrically isolated from materials below the GaN buffer layer 402 prior to the completion of the manufacturing process such that voltages can be applied across the dielectric layers 412, 420 and the GaN buffer layer 402. The manufacturing process of the device 400 as depicted in FIGS. 4A-4C is completed.

In the foregoing discussion and in the claims, the terms "including" and "comprising" are used in an open-ended fashion, and thus should be interpreted to mean "including, but not limited to . . . ." The above description is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method comprising:
    forming a dielectric layer of a solid state device that is partially-manufactured;
    forming a conductive layer of the solid state device in contact with the dielectric layer, the dielectric layer beneath the conductive layer being free of conductive material, the conductive layer having an access pad formed on an end of the conductive layer;
    applying a voltage to the conductive layer using the access pad, the voltage forms an electric field in an area of the dielectric layer beneath the conductive layer; and
    completing manufacture of the solid state device after applying the voltage.

2. The method of claim 1, further comprising removing the access pad prior to completing the manufacture of the solid state device.

3. The method of claim 1, wherein the conductive layer is a metal layer.

4. The method of claim 1, wherein applying the voltage includes stress testing the dielectric layer.

5. The method of claim 1, further comprising forming electric fields in multiple additional dielectric layers in the solid state device prior to completing manufacture of the solid state device.

6. The method of claim 5, wherein forming electric fields in multiple additional dielectric layers comprises applying voltages to inactive areas of multiple additional metal layers.

7. The method of claim 1, wherein the solid state device is selected from the group consisting of gallium nitride (GaN) devices, gallium arsenide devices, gallium oxide devices, and silicon devices.

8. A method, comprising:
providing a dielectric layer of a partially-manufactured device, the dielectric layer having a target portion to be stress tested, the target portion being free of conductive material;
forming a conductive layer, the conductive layer patterned to include a conductive segment above the target portion of the dielectric layer and a discontinuous segment above another portion of the dielectric layer;
placing a probe in contact with the conductive layer;
using the probe to apply a voltage in the conductive layer to form an electric field in the target portion of the dielectric layer; and
after applying the voltage, forming a third layer above the conductive layer.

9. The method of claim 8, wherein forming the conductive layer comprises forming an access pad on an end of the conductive segment.

10. The method of claim 9, wherein placing the probe in contact with the conductive layer comprises placing the probe in contact with the access pad.

11. A method for manufacturing a solid state device, comprising:
providing a dielectric layer, the dielectric layer having a target portion to be stress tested, the target portion being free of conductive material;
forming a conductive layer, the conductive layer patterned to include a conductive segment above the target portion of the dielectric layer and a discontinuous segment above another portion of the dielectric layer;
placing a probe in contact with the conductive layer;
using the probe to apply a voltage in the conductive layer to form an electric field in the target portion of the dielectric layer; and
after applying the voltage, forming a third layer above the conductive layer;
wherein forming the conductive layer comprises forming an access pad on an end of the conductive segment;
wherein placing the probe in contact with the conductive layer comprises placing the probe in contact with the access pad;
further comprising etching away the access pad.

12. A method for manufacturing a solid state device, comprising:
providing a dielectric layer, the dielectric layer having a target portion to be stress tested, the target portion being free of conductive material;
forming a conductive layer, the conductive layer patterned to include a conductive segment above the target portion of the dielectric layer and a discontinuous segment above another portion of the dielectric layer;
placing a probe in contact with the conductive layer;
using the probe to apply a voltage in the conductive layer to form an electric field in the target portion of the dielectric layer; and
after applying the voltage, forming a third layer above the conductive layer;
wherein placing the probe in contact with the conductive layer comprises placing the probe in contact with an inactive area of the conductive layer.

13. The method of claim 8, wherein applying the voltage does not result in an electric field in the another portion of the dielectric layer.

14. The method of claim 8, further comprising adding a field plate above the conductive layer.

15. The method of claim 8, further comprising forming a fourth layer above the third layer, wherein the third layer is a dielectric layer and the fourth layer is a conductive layer, and further comprising applying another voltage to the fourth layer using the probe to form an electric field in the third layer.

16. The method of claim 8, wherein the solid state device is selected from the group consisting of gallium nitride (GaN) devices, gallium arsenide devices, gallium oxide devices, and silicon devices.

17. A method of stress testing a partially-manufactured solid state device, comprising:
obtaining the partially-manufactured solid state device having a dielectric layer and a metal layer formed in contact with the dielectric layer, the dielectric layer beneath the metal layer being free of conductive material; and
applying a voltage to the metal layer of the partially-manufactured solid state device, wherein the voltage forms an electric field in the dielectric layer.

18. The method of claim 17, wherein applying the voltage to the metal layer comprises applying a probe to an access pad formed on the metal layer.

19. The method of claim 17, further comprising applying another voltage to another metal layer in the partially-manufactured solid state device.

* * * * *